United States Patent
Kummerl

(10) Patent No.: US 10,535,594 B2
(45) Date of Patent: Jan. 14, 2020

(54) INTERPOSER WITH EXTRUDED FEED-THROUGH VIAS

(71) Applicant: Texas Instruments Incorporated, Dallas, TX (US)

(72) Inventor: Steven Kummerl, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 359 days.

(21) Appl. No.: 15/000,884

(22) Filed: Jan. 19, 2016

(65) Prior Publication Data

US 2016/0163630 A1 Jun. 9, 2016

Related U.S. Application Data

(63) Continuation of application No. 13/787,284, filed on Mar. 6, 2013, now Pat. No. 9,241,405.

(60) Provisional application No. 61/607,236, filed on Mar. 6, 2012.

(51) Int. Cl.
| | |
|---|---|
| H05K 3/40 | (2006.01) |
| H05K 1/11 | (2006.01) |
| H01L 23/498 | (2006.01) |
| H01L 21/48 | (2006.01) |
| H05K 1/03 | (2006.01) |
| H05K 3/00 | (2006.01) |
| H01L 23/00 | (2006.01) |

(52) U.S. Cl.
CPC ...... *H01L 23/49827* (2013.01); *H01L 21/486* (2013.01); *H01L 23/49816* (2013.01); *H01L 23/49838* (2013.01); *H01L 23/49866* (2013.01); *H01L 23/49894* (2013.01); *H01L 24/09* (2013.01); *H05K 1/0306* (2013.01); *H05K 1/115* (2013.01); *H05K 3/0017* (2013.01); *H01L 2224/08238* (2013.01); *H01L 2924/0002* (2013.01); *H01L 2924/15747* (2013.01); *Y10T 29/49117* (2015.01)

(58) Field of Classification Search
CPC ............................ H05K 3/4046; H05K 1/115
See application file for complete search history.

(56) References Cited

U.S. PATENT DOCUMENTS

| | | | |
|---|---|---|---|
| 5,478,972 A | 12/1995 | Mizutani et al. | |
| 6,093,476 A * | 7/2000 | Horiuchi | H01L 21/486 174/255 |
| 6,265,673 B1 | 7/2001 | Higashida et al. | |

(Continued)

OTHER PUBLICATIONS

Masahiro Sunohara, et al., "Silicon Interposer with TSVs (Through Silicon Vias) and Fine Multilayer Wiring", 58th Electronic Components and Technology Conference, May 27-30, 2008, pp. 847-852.

(Continued)

*Primary Examiner* — Jeremy C Norris
(74) *Attorney, Agent, or Firm* — Ronald O. Neerings; Charles A. Brill; Frank D. Cimino

(57) ABSTRACT

A semiconductor device comprises an interposer with extruded feed-through vias and a semiconductor die. The interposers includes a substrate having a plurality of through-vias. A dielectric liner lining said through-vias. A plurality of feed-thru electrically conducting features provided by a plurality of extruded metal wires within said dielectric liner. A semiconductor die attached to said interposer.

32 Claims, 4 Drawing Sheets

(56) References Cited

U.S. PATENT DOCUMENTS

2005/0277282 A1* 12/2005 Horikawa ............ H05K 3/4046
438/618

OTHER PUBLICATIONS

Michael Minnicino, et al., "Aluminum Alloy 7068 Mechanical Characterization", Weapons and Materials Research Directorate, Army Research Laboratory, Aberdeen Proving Ground, MD, Performing Organization Report No. ARL-TR-4913, Aug. 2009.

* cited by examiner

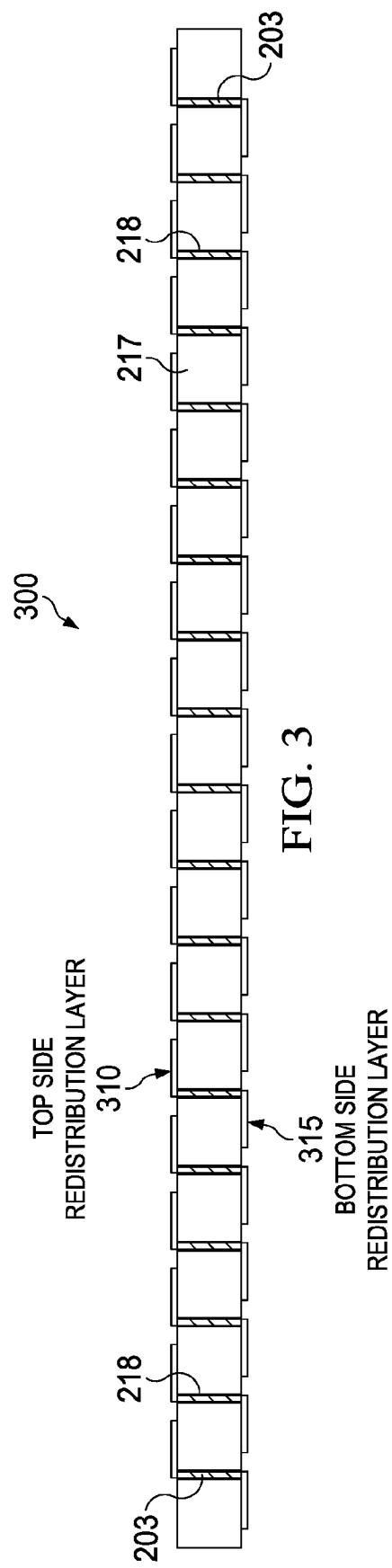

INTERPOSER WITH EXTRUDED FEED-THROUGH VIAS

CROSS REFERENCE TO RELATED APPLICATIONS

This application is a Continuation of and claims the benefit of U.S. patent application Ser. No. 13/787,284, filed on Mar. 6, 2013 and issued on Jan. 19, 2016 as U.S. Pat. No. 9,241,405. Said application/patent claims the benefit of U.S. Provisional Application Ser. No. 61/607,236 entitled "LOW COST INTERPOSER MANUFACTURING", filed Mar. 6, 2012. Said applications are herein incorporated by reference in its entireties.

FIELD

Disclosed embodiments relate to interposers for semiconductor devices and methods for manufacturing interposers.

BACKGROUND

An interposer is an electrical interface providing routing between one socket or connection to another. The purpose of an interposer is generally to spread a connection to a wider pitch or to reroute a connection to a different connection. A typical interposer example application is for providing routing between an integrated circuit (IC) die to a ball grid array (BGA) on a substrate, such as the IC die on the interposer on a BGA substrate.

In a conventional method for forming interposers, through-vias are formed, which are dielectric lined, and then the dielectric lined vias are filled with a metal. For example, a silicon wafer may be thinned, such as from a thickness of about 800 μm to about 150 to 250 μm to remain rigid enough still be able to handled without a support carrier. Silicon through-vias are then formed by deep reactive ion etching (DRIE) process. A convention DRIE process is a Bosch process for forming through vias in silicon substrates which uses a fluorine based plasma chemistry to etch the silicon, combined with a fluorocarbon plasma process to provide sidewall passivation and improved selectivity to masking materials. A complete etch process cycles between etch and deposition steps many times to achieve deep, substantially vertical etch profiles. The Bosch process offers higher etch rates, but at the cost of sidewall roughness in the form of scalloping.

A dielectric layer (e.g., $SiO_2$) is then formed by conventional thermal oxidation or a deposition process to dielectric line the through-vias. Alternatively, use of a dielectric (e.g., glass) substrate allows through-via formation without the need for a dielectric lining.

In the case of silicon substrates, through-silicon vias (TSVs) are then formed by filling the dielectric lined vias, such as by a copper (Cu) seed layer followed by Cu electroplating, and then planarization using chemical mechanical polishing (CMP). For dielectric substrates, the through-vias are analogously metal filled.

Multilayer wiring on one or both sides of the interposer can then be formed by Cu plating using a conventional semi additive process (SAP). Micro bumps can then be fabricated on the top side of the interposer by electroplating, which allows IC chip(s) to be mounted on the top side of the interposer.

SUMMARY

Disclosed embodiments include methods of forming interposers and interposers therefrom. Disclosed methods include positioning a plurality of extruded metal wires across a first platten and second platen which secure the wires. As used herein, the term "metal wires" includes metal alloy wires, and coated metal wires. A sealing material is added to sidewalls of a volume having the extruded metal wires within, with the first and second plattens as end plates to form a holding volume which functions to hold a filling material or a filling material precursor. The holding volume can then be filled through an aperture in the holding volume (e.g., in the top of the holding volume) with a dielectric filling material (e.g., a powder). Alternatively, the extruded metal wires can have a dielectric coating thereon, which allows the filling material to be a non-dielectric material, such as a semiconductor material.

The filling material is heated to a sufficient temperature to form a heat treated filled volume. The sealing material is removed, and the heat treated filled volume is then sawed into a plurality of slices having a predetermined thickness to form a plurality of interposer substrates having a plurality of feed-thru conducting features provided by the plurality of extruded metal wires.

As used herein "extruded metal wires" as known in the art of metallurgy refers to a crystal structure which evidences a preferential orientation and elongation of the crystal (non-random distribution of crystal orientation), being a preferential crystal orientation resulting from the extrusion manufacturing process where the crystals become preferentially aligned and elongated along the extrusion direction. The extrusion direction corresponds to the length direction of the disclosed extruded metal wires which provide the feed-through vias for the interposer.

BRIEF DESCRIPTION OF THE DRAWINGS

Reference will now be made to the accompanying drawings, which are not necessarily drawn to scale, wherein:

FIG. 3 is a cross sectional depiction of an example interposer substrate including extruded metal wires providing feed-through vias, according to an example embodiment.

DETAILED DESCRIPTION

Figure 1:
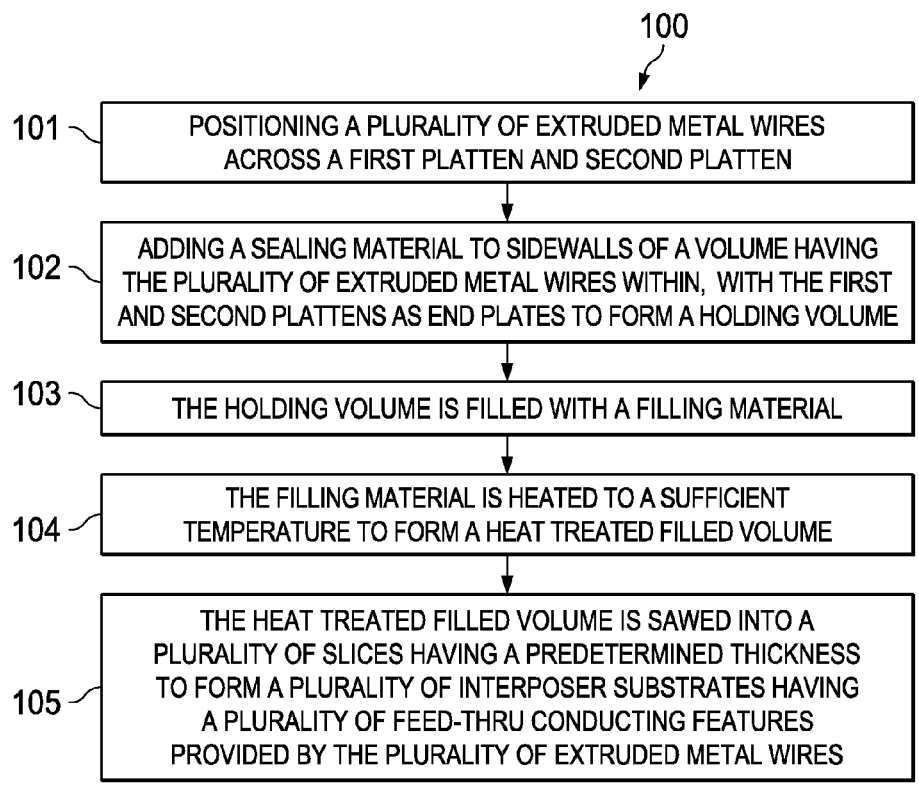
FIG. 1 is a flow chart that shows steps in an example method for forming interposers having extruded metal wires providing feed-through vias, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for forming interposers having extruded metal wires providing feed-through vias, according to an example embodiment. Step 101 comprises positioning a plurality of extruded metal wires across a first platten and second platen which secures the extruded metal wires. FIG. 2A depicts extruded metal wires 203, which can comprise strand copper wires as example metal wires across two plattens 206 and 207 in a desired (pattern) density.

As noted above, extruded metal wires 203 may also comprise a metal alloy. The extruded metal wires 203 may also include a non-oxidizing metal layer coating the extruded metal wires 203, such as a Pd or Pt coating layer. Plattens 206, 207 can take any shape, and are shown round only for illustration. Plattens 206, 207 generally include holes sized for the extruded metal wires 203 to be fit therethrough. The pattern of metal wires 203 can be uniform or non-uniform. An example platten material is stainless steel, but the platten material can vary depending on the materials that will be heat processed.

Step 102 comprises adding a sealing material 212 to sidewalls of a volume the plurality of extruded metal wires within, with the first and second plattens 206, 207 as end plates to form a holding volume. The holding volume is configured to prevent the filler material or filler material precursor from escaping. Example sealing materials 212 include stainless steel and titanium. The sealing material can be configured as a mold, and can also be fit together in a variety of ways including using a clamping mechanism, or fit with a locking pin. FIG. 2B depicts the sealing material 212 sealing the sidewall area of the cylindrical volume (holding volume) between the plattens 206, 207 to enable receiving (and holding) filling material as described below, typically by providing a top face having one or more apertures (not shown) to allow filling.

Step 103 comprises filling the sealed volume using aperture(s) provided. The filling material can comprise a powder or a viscous liquid, such as a monomer (precursor) of a thermoset resin. FIG. 2C depicts a holding volume after being filled with a filling material 217 which fills the holding volume between the extruded metal wires 203. The filling material 217 can be liquid or powder (e.g., soda lime glass powder, or a borosilicate powder).

Step 104 comprises heating the filling material to a sufficient temperature to form a heat treated filled volume. In the case of a powder, the sufficient temperature is at least equal to the softening point of the powder. In the case of a monomer, the sufficient temperature is high enough to cure (i.e., crosslink) the monomer. In one specific example the sufficient temperature is about 830° C. to be at or above the softening point of borosilicate glass. In the case of borosilicate glass and copper wires, the borosilicate glass softens below copper melting point (about 1080° C.).

Step 105 comprises sawing the heat treated filled volume into a plurality of slices having a predetermined thickness to form a plurality of interposer substrates having a plurality of feed-thru conducting features provided by the plurality of extruded metal wires 203. FIG. 2D depicts a saw blade 293 immediately before sawing the heat treated filled volume. A laser or other saw apparatus may also be used. The sawing can be configured to provide a desired interposer thickness typically in the range of 600 to 875 µm to accommodate conventional wafer (e.g., silicon wafer) handling equipment during assembly. A chemical mechanical polish (CMP) can also be incorporated to further smooth the top and/or bottom surface of the interposers if desired.

Figure 2E:
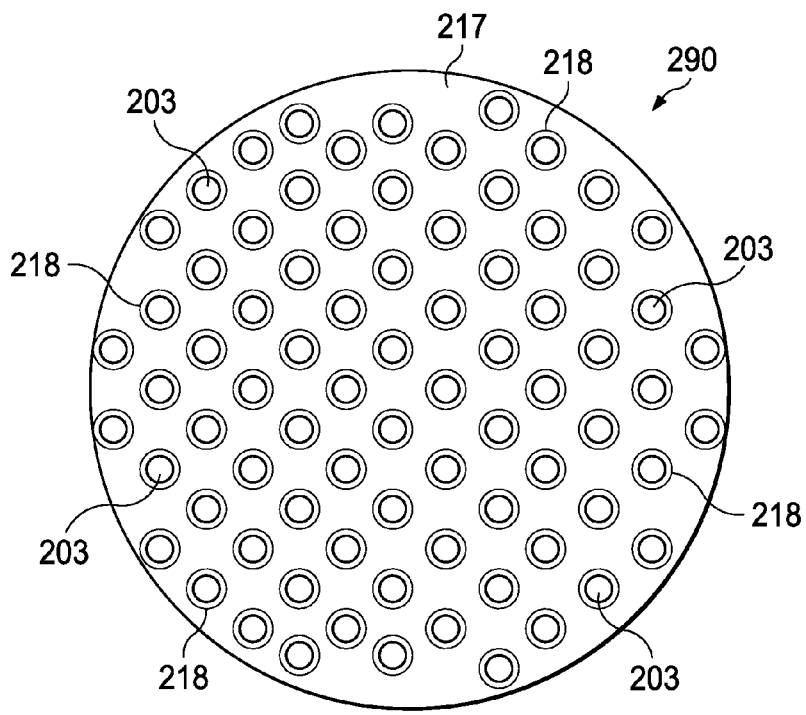
FIG. 2E depicts a top view of an example interposer substrate having extruded metal wires providing feed-through vias obtained after sawing.
Figure 2A:
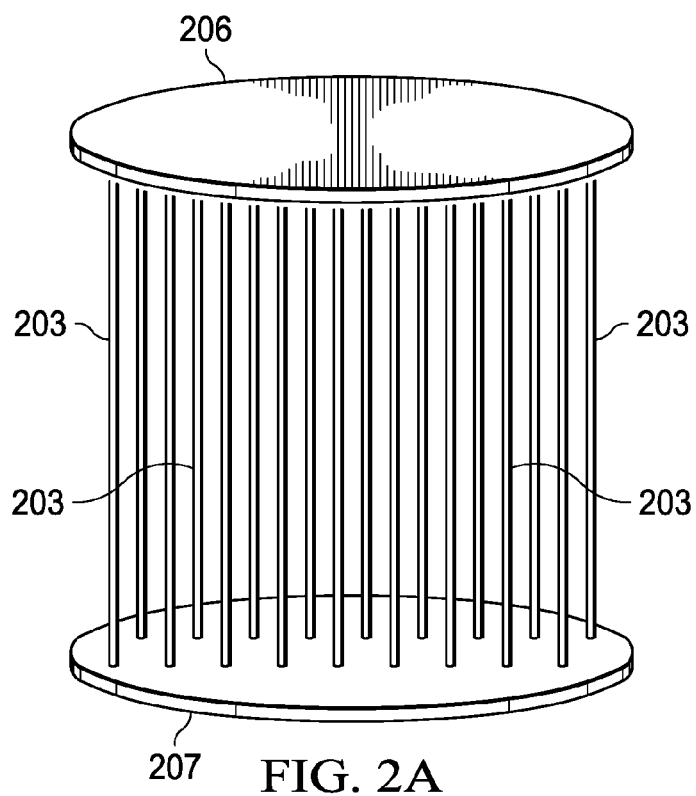
FIGS. 2A-D depict process progression for the example method of forming interposers having extruded metal wires providing feed-through vias described relative to FIG. 1.
Figure 2B:
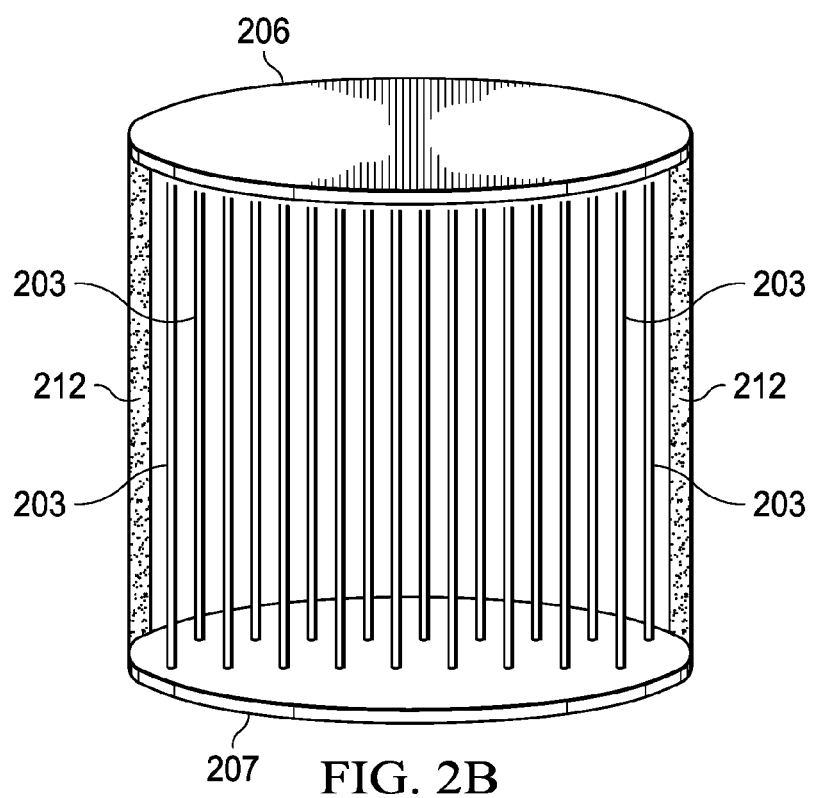
Figure 2C:
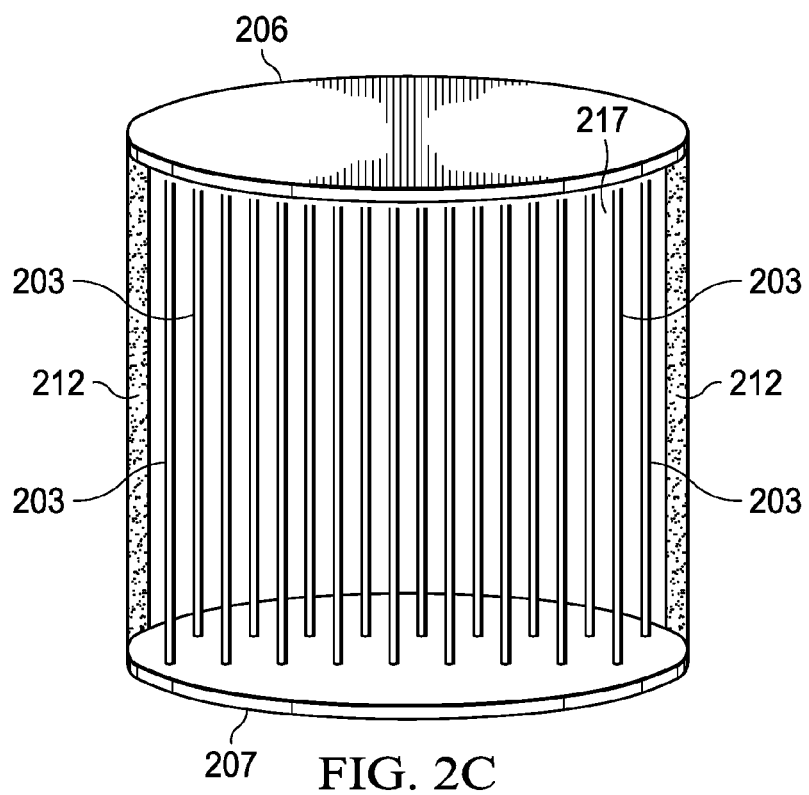
Figure 2D:
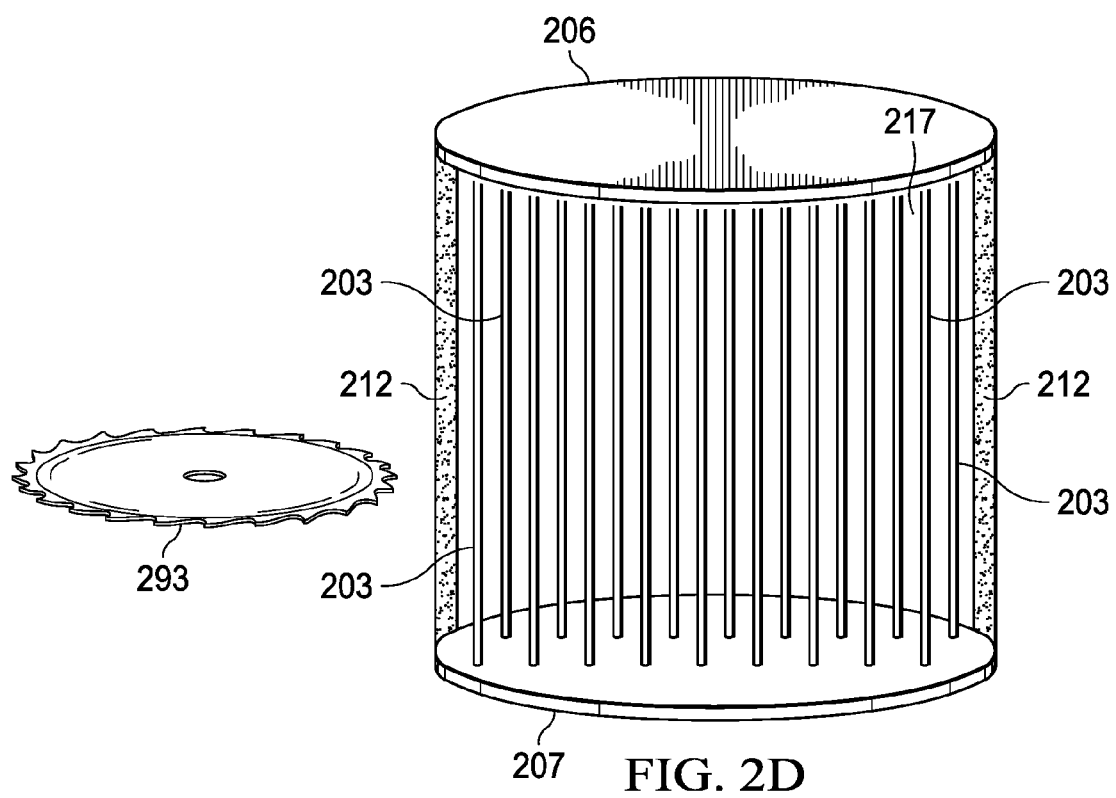

FIG. 2E depicts a top view of an example interposer substrate 290 obtained after removing the sealing material 212, and then sawing. Interposer substrate 290 includes extruded metal wires 203, and the filler material 217. A dielectric liner 218 is between the filler material 217 and the metal wires 203. The substrate 290 and dielectric liner 218 provide scallop-free vertical sidewalls along a full thickness of the through-vias occupied by the metal wires 203. As noted above, conventional Bosh etching leads to scalloped sidewalls. When the extruded metal wires 203 comprise copper, there can be a direct physical connection (no intervening seed layer) between the dielectric liner 218 and the extruded copper wires.

Advantages of disclosed methods from incorporating the through-vias (e.g., extruded metal wires) during the raw material manufacturing step which can reduce the chemistry and infrastructure needed to accommodate an electrically conductive feed-thru as compared to conventional methods for forming interposers that first form the through-vias in a substrate, and then fill the feed through-vias with a metal. For example, the need for DRIE etching of the vias is eliminated, as well as the need for metal deposition.

Disclosed interposers can include the option of adding one or more wiring layers (e.g., multilayer wiring) on one or both sides of the interposer for customizing routing patterns on one or both sides of the interposer. Subsequent steps to redistribute the feed-thru vias are also possible using contemporary patterning techniques available in backend of the line (BEOL) semiconductor processing, such as formation of a dielectric layer then a redistribution layers (RDL) thereon. On one example, multilayer wiring can be formed on one or both sides by metal (e.g., Cu) electroplating using a conventional semi additive process (SAP). Micro bumps can then be fabricated on the wiring layer by electroplating, which allows a bump pattern to be customized to match the bond pad pattern of IC chip(s) to be mounted on the interposer.

For example, FIG. 3 is a cross sectional depiction of an example interposer substrate 300 including extruded metal wires 203 providing feed-through vias, according to an example embodiment. A dielectric liner 218 is between the filler material 217 and the extruded metal wires 203. Interposer substrate 300 includes a top side RDL 310 and a bottom side RDL 315 which allow the routing pattern provided to be customized on respective sides of the interposer substrate 300.

Disclosed interposer substrates can be integrated into a variety of assembly flows to form a variety of different semiconductor devices and related products having one or more semiconductor die and one or more other substrates. The substrates can include organic or ceramic substrates. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A semiconductor device package, comprising:
   an interposer comprising:
      a substrate having a plurality of through-vias;
      a plurality of feed-thru electrically conducting features provided by a plurality of dielectrically coated metal wires within the through-vias; and
   a semiconductor die attached to the interposer.

2. The semiconductor device package of claim 1, further comprising one or more wiring layers.

3. The semiconductor device package of claim 2, wherein the one or more wiring layers are on one side of the interposer for customizing routing patterns on one side of the interposer.

4. The semiconductor device package of claim 2, wherein the one or more wiring layers are on both sides of the interposer for customizing routing patterns on both sides of the interposer.

5. The semiconductor device package of claim 2, further comprising a plurality of micro bumps fabricated on the wiring layer by electroplating.

6. The semiconductor device package of claim 5, wherein the plurality of micro bumps are in a bump pattern customized to match a bond pad pattern of the semiconductor die.

7. The semiconductor device package of claim 1, wherein the dielectrically coated extruded metal wires comprise dielectrically coated extruded copper wires that are in direct physical contact with the substrate.

8. The semiconductor device package of claim 1, wherein the substrate is a non-dielectric material.

9. The semiconductor device package of claim 1, wherein the metal wires are extruded.

10. A semiconductor device package, comprising:
an interposer, comprising:
    a non-dielectric substrate having a plurality of through-vias;
    a dielectric liner lining the through-vias;
    a plurality of feed-thru electrically conducting features provided by a plurality of metal wires within the dielectric liner; and
    a semiconductor die attached to the interposer.

11. The semiconductor device package of claim 10, further including one or more wiring layers are on one side of the interposer for customizing routing patterns on one side of the interposer.

12. The semiconductor device package of claim 11, further comprising a plurality of micro bumps fabricated on the wiring layer by electroplating.

13. The semiconductor device package of claim 10, further including one or more wiring layers are on both sides of the interposer for customizing routing patterns on both side of the interposer.

14. The semiconductor device package of claim 13, further comprising a plurality of micro bumps fabricated on at least one of the wiring layers by electroplating.

15. The semiconductor device package of claim 10, wherein said extruded metal wires comprise extruded copper wires that are in direct physical contact with the dielectric liner.

16. The semiconductor device package of claim 10, wherein the dielectric material comprises a borosilicate glass.

17. The semiconductor device package of claim 10, wherein the metal wires are extruded.

18. A method of making a packaged semiconductor device, comprising:
providing an interposer, comprising:
    a substrate having a plurality of through-vias;
    a plurality of feed-thru electrically conducting features provided by a plurality of dielectrically coated metal wires within the through-vias; and
attaching a semiconductor die to the interposer.

19. The method of claim 18, further including one or more wiring layers on one side of the interposer for customizing routing patterns on one side of the interposer.

20. The method of claim 18, further including one or more wiring layers on both sides of the interposer for customizing routing patterns on both side of the interposer.

21. The method of claim 18, wherein said dielectrically coated metal wires comprise dielectrically coated copper wires that are in direct physical contact with the substrate.

22. The method of claim 18, wherein the substrate is a non-dielectric material.

23. The method of claim 18, further comprising fabricating a plurality of micro bumps on the wiring layer by electroplating.

24. The method of claim 22, wherein the plurality of micro bumps are in a bump pattern customized to match a bond pad pattern of a semiconductor die.

25. The method of claim 18, wherein the metal wires are extruded.

26. A method of making a packaged semiconductor device, comprising:
providing an interposer, comprising:
    a non-dielectric substrate having a plurality of through-vias;
    a dielectric liner lining the through-vias;
    a plurality of feed-thru electrically conducting features provided by a plurality of metal wires within the dielectric liner; and
attaching a semiconductor die to the interposer.

27. The method of claim 26, further including one or more wiring layers on one side of the interposer for customizing routing patterns on one side of the interposer.

28. The method of claim 26, further including one or more wiring layers on both sides of the interposer for customizing routing patterns on both side of the interposer.

29. The method of claim 26, wherein said metal wires comprise copper wires that are in direct physical contact with the substrate.

30. The method of claim 26, further comprising fabricating a plurality of micro bumps on the wiring layer by electroplating.

31. The method of claim 30, wherein the plurality of micro bumps are in a bump pattern customized to match a bond pad pattern of a semiconductor die.

32. The method of claim 26, wherein the metal wires are extruded.

* * * * *